(12) United States Patent
Moriya

(10) Patent No.: US 6,462,692 B1
(45) Date of Patent: Oct. 8, 2002

(54) DIGITAL-TO-ANALOG CONVERTER AND DIGITAL-TO-ANALOG CONVERTING METHOD

(75) Inventor: Masahiro Moriya, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/233,435

(22) Filed: Jan. 20, 1999

(30) Foreign Application Priority Data

Jan. 27, 1998 (JP) .......................................... 10-029326
Sep. 11, 1998 (JP) .......................................... 10-258355

(51) Int. Cl.[7] ................................................ H03M 1/82
(52) U.S. Cl. ...................................... 341/152; 341/144
(58) Field of Search ................................ 341/152, 143, 341/144, 145, 131; 340/347

(56) References Cited

U.S. PATENT DOCUMENTS

| | | | |
|---|---|---|---|
| 5,148,168 A | * 9/1992 | Masuda et al. | 341/152 |
| 5,712,636 A | * 1/1998 | Buch | 341/152 |
| 5,815,102 A | * 9/1998 | Melanson | 341/143 |
| 6,150,969 A | * 11/2000 | Melanson | 341/143 |
| 6,252,530 B1 | * 6/2001 | Harada | 341/143 |
| 6,256,395 B1 | * 7/2001 | Melanson | 381/312 |

FOREIGN PATENT DOCUMENTS

| | | |
|---|---|---|
| JP | 57-46526 | 3/1982 |
| JP | 61236223 | 10/1986 |
| JP | 3-53041 | 5/1991 |
| JP | 6-152426 | 5/1994 |
| JP | 7-135469 | 5/1995 |

OTHER PUBLICATIONS

An English Language abstract of JP 3–53041.
English Language Abstract of JP 57–46526.
English Language Abstract of JP 61–236223.
English Language Abstract of JP 7–135469.
English Language Abstract of JP 6–152426.

* cited by examiner

Primary Examiner—Peguy JeanPierre
Assistant Examiner—Joseph Lauture
(74) Attorney, Agent, or Firm—Greenblum & Bernstein, P.L.C.

(57) ABSTRACT

In a digital-to-analog converter comprising a pulse-width modulation signal generator for generating a pulse-width modulation signal by pulse-width modulating an actual set value with a count value, and a low-pass filter for removing a high frequency component of the pulse-width modulation signal so as to output an analog signal, a difference between a current target digital value and a previous target digital value are multiplied by a coefficient determined from a time constant of the low-pass filter and a cycle of the target set value, and the multiplied value is added to the previous target set value so as to calculate the actual set value.

13 Claims, 6 Drawing Sheets

DIGITAL-TO-ANALOG CONVERTER AND DIGITAL-TO-ANALOG CONVERTING METHOD

BACKGROUND OF THE INVENTION

1. Field of the Invention

The present invention relates to a digital-to-analog converter for converting a digital signal to an analog signal, and relates to its method.

2. Description of the Related Art

There is known a digital-to-analog converter of a pulse width modulation (PWM) system. This type of digital-to-analog converter inputs a pulse signal, which is pulse-width modulated in accordance with a digital value, to a low-pass filter, and converts it to an analog value. There is also known a digital-to-analog converter of a pulse density modulation (PDM) system. This type of digital-to-analog converter inputs a pulse signal, which is pulse-density modulated in accordance with a digital value, to a low-pass filter, and converts it to an analog value.

In either of these digital-to-analog converters, a response speed (digital/analog converting speed) depends on a time constant of the low-pass filter.

FIG. 1 is a functional block diagram of a conventional digital-to-analog converter of a PWM system. The digital-to-analog converter shown in FIG. 1 comprises a PWM signal generating section 103 having a counter 101 and a comparator 102, and a low-pass filter 104.

The counter 101 cyclically counts a count value 105 having the same number of bits as the number of set bits of a D/A conversion, and outputs the count value 105 to the comparator 102.

The comparator 102 compares the count value 105 with a set digital value 106, and outputs a PWM signal 107 to the low-pass filter 104. More specifically, the comparator 102 pulse-width modulates the set digital value 106 using the count value 105 (a duty ratio is varied). The pulse signal, which is obtained by pulse-width modulating the set digital value 106, is the PWM signal 107.

The low-pass filter 104 removes a high frequency component of the PWM signal 107, thereby outputting a voltage value corresponding to the set digital value 106, that is, an analog signal 108.

The above digital-to-analog converter of a PWM system has an advantage in which a circuit scale is smaller than a general digital-to-analog converter of a resistance array type.

However, in the above digital-to-analog converter of a PWM system, the response speed depends on the time constant of the low-pass filter 104. In order to realize the same degree of the response speed as the general digital-to-analog converter of a resistance array type, the operation frequency of the counter 101 provided in the PWM signal generating section 103 must be more increased, and this increases a consumption current.

SUMMARY OF THE INVENTION

An object of the present invention is to provide a digital-to-analog converter, which can realize a high response speed as operating a counter at low speed to a minimum so as to reduce a consumption current, and its method.

The present invention provides a digital-to-analog converter comprising:

a pulse-width modulator for pulse-width modulating an actual set value using a count value so as to generate a pulse-width modulation signal;

a low-pass filter for removing a high frequency component of the pulse-width modulation signal so as to output an analog signal; and an actual set value calculator for multiplying a difference between a current target set value and a previous target set value by a coefficient determined from a time constant of the low-pass filter and a cycle of the target set value, and for adding the multiplied value to the previous target set value so as to calculate the actual set value.

According to the above-structured digital-to-analog converter, the pulse-width modulation is performed using the actual set value, which can bring about a variation, which is larger than a target digital value in a unit time, to the analog output value of the low-pass filter. The analog signal, which is the analog output of the low-pass filter, can be varied at higher speed. As a result, it is unnecessary to perform the pulse-width modulation with the count value of the operation frequency that is more than necessary. This can reduce the consumption current.

Also, the present invention provides a digital-to-analog converter comprising a pulse-density modulator, in place of the pulse-width modulator, for reversing upper and lower bits of the count value so as to pulse-density modulate the actual set value with the reversed count value and to be output to the low-pass filter.

According to the above-structured digital-to-analog converter, the analog signal having high stability and a small number of ripples can be generated as compared with the pulse-width modulator.

Moreover, the present invention provides a digital-to-analog converter comprising an coefficient setting function for changing the coefficient by which the difference between the target set value and the previous target set value are multiplied in accordance with a polarity of the difference.

According to the above-structured digital-to-analog converter, since the response speed can be accurately adjusted by the positive and negative changes, it is possible to realize the high-speed response using the low-speed operation frequency, thereby making it possible to reduce the consumption current.

Furthermore, the present invention provides a digital-to-analog converter comprising:

a determining section for determining whether or not the actual set value exceeds a set capable range; and a selecting section for selecting the current target set value as the actual set value when the actual set value exceeds the set capable range as a result of the determination.

According to the above-structured digital-to-analog converter, the A/D conversion processing in the vicinity of the maximum value of the set capable range and the minimum value thereof can be executed without having a complicated processing. In other words, the A/D conversion processing can be accurately executed without increasing the consumption current.

Also, the present invention provides a digital-to-analog converter comprising:

a determining section for determining whether or not the actual set value exceeds a set capable range; and a correcting section for prolonging a set cycle to lessen the coefficient by which the difference between the set target set value and the previous target set value are multiplied so as to calculate the actual set value cycle when the actual set value exceeds the set capable range as a result of the determination.

According to the above-structured digital-to-analog converter, the analog signal can be generated at higher speed even in the vicinity of the maximum value of the set capable range and the minimum value thereof. Therefore, the PWM or PDM signal generating function can be operated at low speed in the entire set capable range, thereby making it possible to improve the reduction in consumption current.

DETAILED DESCRIPTION OF THE PREFERRED EMBODIMENTS

Embodiments of the digital-to-analog converter of the present invention will be specifically described with reference to the drawings.

First Embodiment

Figure 1:
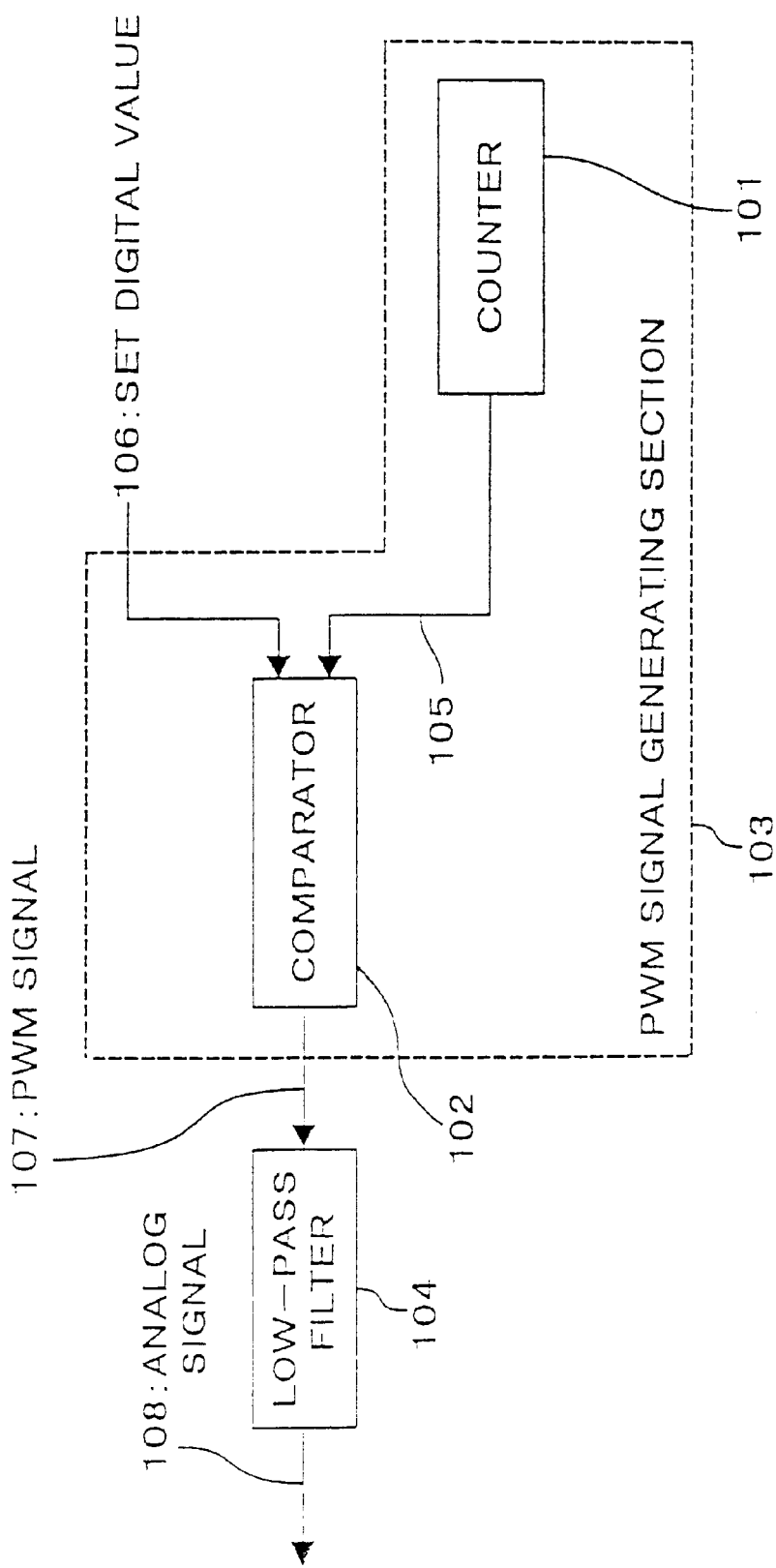
FIG. 1 is a block diagram showing a general digital-to-analog converter of a PWM type.
Figure 2:
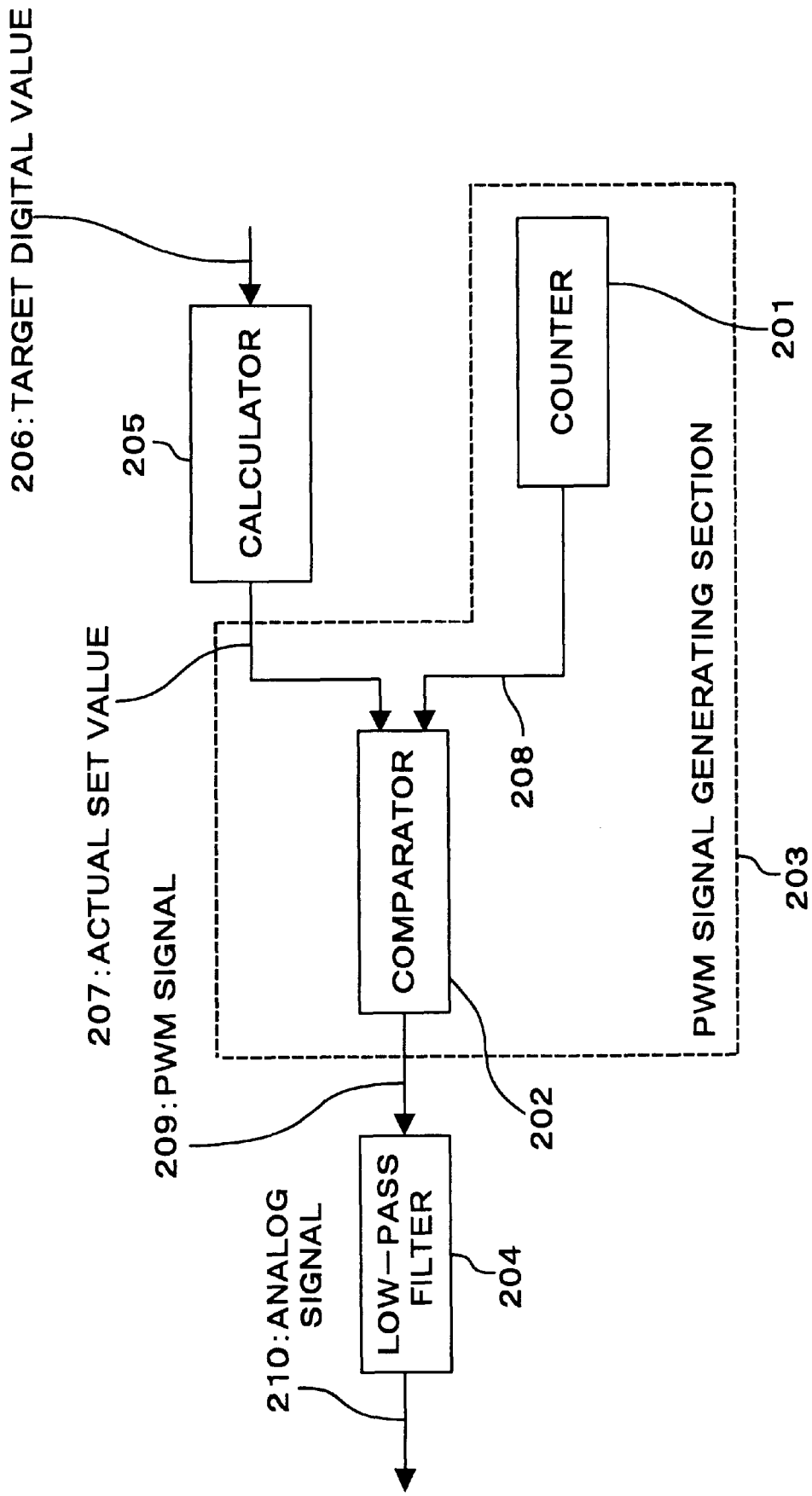
FIG. 2 is a block diagram showing a digital-to-analog converter according to a first embodiment of the present invention.

FIG. 2 is the block diagram showing the digital-to-analog converter according to the first embodiment of the present invention. The digital-to-analog converter shown in FIG. 2 comprises a PWM signal generating section 203 having a counter 201 and a comparator 202, and a low-pass filter 204, and a set value calculator 205.

The set value calculator 205 obtains a difference between a current target digital value 206 and a previous target digital value 206. Then, the set value calculator 205 multiplies the obtained difference by a coefficient, which is determined by a time constant of the low-pass filter 204 and a set cycle of the target digital value 206. Then, the set value calculator 205 adds the multiplied value to the previous target digital value 206 to calculate an actual set value 207 corresponding to the current target digital value 206.

The counter 201 cyclically counts a count value 208 having the same number of bits as the number of bits to be used in a digital-to-analog conversion. The count value 208 output from the counter 202 is sent to the comparator 202.

The comparator 202 compares the count value 208 with the actual set value 207. Then, the comparator 202 outputs the PWM signal 207, which has been obtained based on the comparison result, to the low-pass filter 204. In other words, the comparator 202 pulse-width modulates the actual set value 207 using the count value 208. Then, the comparator 202 outputs the PWM signal 209, which is the modulation result, to the low-pass filter 204. As mentioned above, the actual set value 207 is multiplied by the coefficient to obtain a numeric value, which is larger than the target digital value 206. Therefore, the pulse width of the PWM signal, which has been obtained by pulse-width modulating the actual set value 207, is larger than the target digital value 206.

The low-pass filter 204 outputs an analog voltage from which a high frequency component is removed. The PWM signal 209 is pulse-width modulated by the actual set value 207, which is larger than the target digital value 206. Therefore, the analog voltage output from the low-pass filter 204 abruptly rises since the pulse width of the PWM signal in a high level state is long.

Next, an operation of the above-structured digital-to-analog converter will be explained.

It is assumed that the current target digital value is $D_{CRU}$, the previous target digital value is $D_{PRE}$, the set cycle of the target digital value 206 is T, the time constant of the low-pass filter 204 is $C_T$, a digital value-to-analog voltage ratio is R, and passing time is t. If the target digital value 206 is directly set in the comparator 202, the analog voltage output from the low-pass filter 204 can be expressed by the following equations (1) and (2):

$$\text{When } D_{CUR} > D_{PRE}, \text{ Analog voltage} = R \times [D_{PRE} + (D_{CUR} - D_{PRE})\{1 - \exp(-t/C_T)\}] \quad (1)$$

$$\text{When } D_{PRE} > D_{CUR}, \text{ Analog voltage} = R \times [D_{PRE} - (D_{CUR} - D_{PRE})\{\exp(-t/C_T)\}] \quad (2)$$

In this case, the actual analog voltage becomes small since the variation of the digital value is multiplied by the coefficient $\{1-\exp(-t/C_T)\}$ or $\{\exp(-t/C_T)\}$. Due to this, in this embodiment, the variation of the digital value is multiplied by the inverse of the coefficient such that an apparent target digital set value becomes large.

In other words, the actual set value 207 can be calculated from the following equations (3) and (4):

$$\text{When } D_{CUR} > D_{PRE}, \text{ Actual set value} = D_{PRE} + (D_{CUR} - D_{PRE})/\{1 - \exp(-T/C_T)\} \quad (3)$$

$$\text{When } D_{PRE} > D_{CUR}, \text{ Actual set value} = D_{PRE} - (D_{CUR} - D_{PRE})/\{\exp(-T/C_T)\} \quad (4)$$

Moreover, in a case where the target digital value $D_{CUR}$, which is currently set, is exactly the same as the previous target digital value $D_{PRE}$, the analog voltage currently reaches the analog voltage corresponding to the previous target digital value $D_{PRE}$. For this reason, the current target digital value $D_{CUR}$ is set to the previous target digital value $D_{PRE}$ again.

The actual set value 207, which the set value calculator 205 has calculated from the equations (3) and (4), becomes the numeric value, which is sufficiently larger than the target digital value 206. The comparator 202 pulse-width modulates the actual set value 207 using the count value so as to generate the PWM signal 209. For example, if the calculated actual set value 207 is ten times as large as the target digital value 206, the pulse width of the PWM signal 209 in the high level state increases by 10 times.

As compared with the low-pass filter to which the PWM signal having the pulse width obtained by directly pulse-modulating the target digital value 206, the use of the low-pass filter 204, to which the PWM signal 209 having such a 10-fold pulse width is input, results in an abrupt increase in the analog voltage. Moreover, at the time when the analog output of the low-pass filter 204 reaches the analog voltage corresponding to the target digital value 206, the target digital value 206 is updated and the actual set value 207 to be set in the comparator 202 is reset.

In other words, the set value 207, which is higher than the target digital value 206, is set in the comparator, so that the analog output of the low-pass filter 204 can be abruptly varied. Moreover, it is possible to reduce time required when the analog output of the low-pass filter 204 reaches the analog voltage corresponding to the target digital value 206 without increasing the operation speed of the counter 201. Also, at the time when the analog output of the low-pass filter 204 reaches the analog voltage corresponding to the target digital value 206, the actual set value 207 to be set in the comparator 202 is reset. Thereby, the analog voltage corresponding to the target digital value 206 can be obtained.

Thus, according to the first embodiment, the numeric value of the actual set value 207 to be set in the comparator 202 is increased. As a result, an analog signal 210 can be varied at high speed even if the counter 203 is operated with the same operation frequency as the conventional case.

Conversely, this can decrease the operation frequency of the counter 203, so that the consumption current can be reduced.

Second Embodiment

Figure 3:
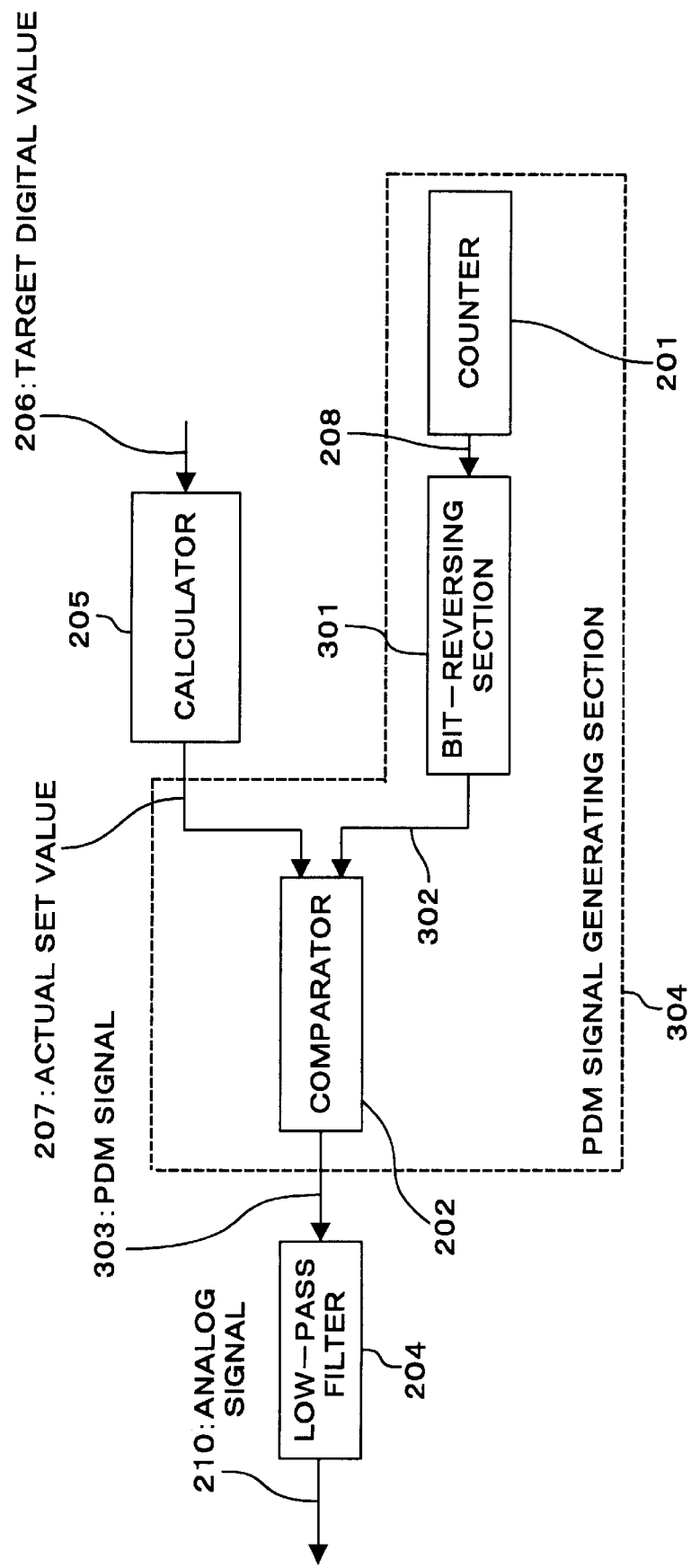
FIG. 3 is a block diagram showing a digital-to-analog converter according to a second embodiment of the present invention.

FIG. 3 is the block diagram showing the digital-to-analog converter according to the second embodiment of the present invention. The digital-to-analog converter shown in FIG. 3 further comprises a bit reverse section 301 in addition to the same structure elements as the first embodiment. The bit reverse section 301 reverses the upper and lower bits of the count value 208 of the counter 201, and outputs the result to the comparator 202. The count value reversed by the bit reverse section 301 is referred as a reserve count value 302.

The bit reverse section 301 is thus provided, so that the signal output from the comparator 202 results in a signal (PDM signal) 303, which is pulse-density modulated. In other words, a PDM signal generating section 304 is constituted by the counter 201, the bit reverse section 301, and the comparator 202.

The PDM signal 303 output from the PDM signal generating section 304 is passed through the low-pass filter 202 so as to be converted to the analog signal 210.

According to the second embodiment, the upper and lower bits of the count value 208 are reversed, and the actual set value 207 is pulse-density modulated by use of the reverse count value 302. Since the pulse width is short in the pulse-density modulation, the analog signal, which is more stable than the pulse-width modulation of the first embodiment, can be generated. Namely, the consumption current can be reduced similar to the first embodiment, and the stable analog signal having a small ripple can be generated.

Third Embodiment

This embodiment shows an example of a mobile radio terminal apparatus for performing a gain control of a transmission gain amplifier by use of the digital-to-analog converter of the PDM system explained in the second embodiment.

Figure 4:
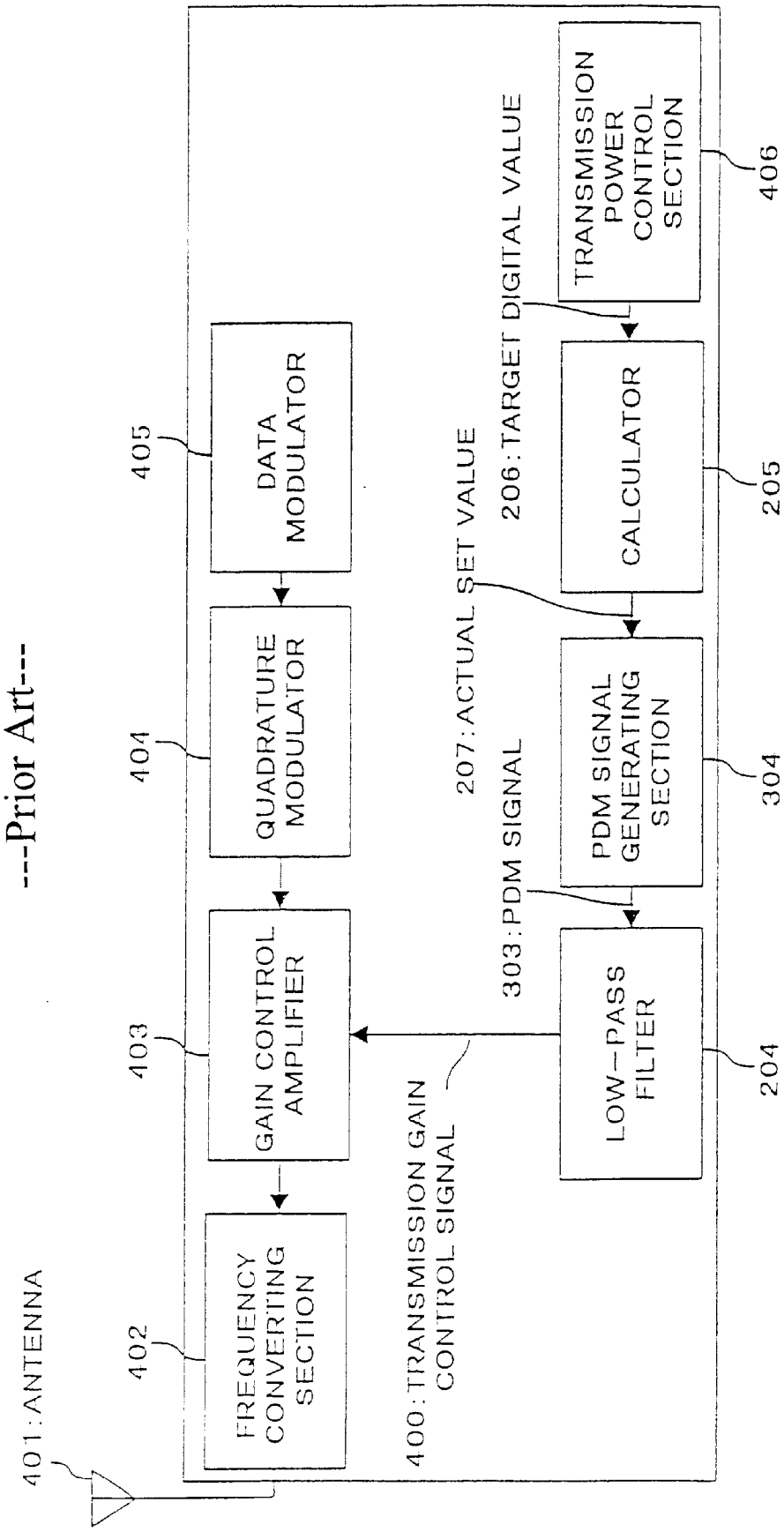
FIG. 4 is a block diagram of a mobile radio terminal apparatus according to a third embodiment of the present invention.

FIG. 4 shows the functional block of the mobile radio terminal apparatus having the digital-to-analog converter of the PDM system according to the third embodiment. It should be noted that the same reference numerals are added to the portions having the same functions as the digital-to-analog converter of the PDM system explained in the second embodiment.

The mobile radio terminal apparatus of FIG. 4 comprises an antenna 401, a frequency converting section 402, a gain control amplifier 403, a quadrature modulator 404, a data modulator 405, a transmission power control section 406, the set value calculator 205, the PDM signal generating section 204, and the low-pass filter 104.

The data modulator 405 digitally modulates information data to be transmitted so as to generate a baseband signal. Then, the data modulator 405 outputs the generated baseband signal to the quadrature modulator 404.

The quadrature modulator 404 modulates the bandband signal in a quadrature manner, and generates an intermediate frequency band signal. Then, the quadrature modulator 404 outputs the intermediate frequency band signal to the gain control amplifier 403.

The gain control amplifier 403 amplifies amplitude of the intermediate frequency band signal so as to be output to the frequency converter 402. The frequency converter 402 converts the amplified intermediate frequency band signal to a radio frequency band, and the radio frequency band radiates into space through the antenna 401.

The transmission power control section 406 controls power level to be transmitted. Specifically, the transmission power control section 406 outputs the digital value, corresponding to the analog signal having a target power level, to the set value calculator 205 as the target digital value 206.

The set value calculator 205 generates the actual set value 207 to which the variation larger than the target set value is added by the calculation method explained in the first embodiment. Then, the set value calculator 205 outputs the actual set value 207 to the PDM signal generating section 304.

The PDM signal generating section 304 PDM converts the actual set value 207 as explained in the second embodiment. Then, the PDM signal 303 thus obtained is output to the low-pass filter 204.

The low-pass filter 204 converts the PDM signal 303 to the analog voltage corresponding to the actual set value 207 by removing the high frequency component. Then, the low-pass filter 204 outputs the analog voltage to the gain control amplifier 403 as a transmission gain control signal 400. Then, the gain of the gain control amplifier 403 is controlled by the transmission gain control signal 400.

Thus, according to the third embodiment, the transmission power control requiring the high-speed response can be executed using the digital-to-analog converter of the PDM system having a difficulty in high-speed response due to the time constant of the low-pass filter 204. Also, since the counter of the digital-to-analog converter of the PDM system can be operated at low speed, the reduction in power consumption can be improved.

In FIG. 4, even if the PWM signal generating section 203 explained in the first embodiment is used in place of the PDM signal generating section 304, the same effect as the third embodiment can be obtained.

Fourth Embodiment

The fourth embodiment of the present invention shows an example of the digital-to-analog converter, which determines whether or not the digital value to be set exceeds a certain range, and which uses the target digital value when the value exceed the range, in addition to the structural elements of the digital-to-analog converter of the first embodiment.

Figure 5:
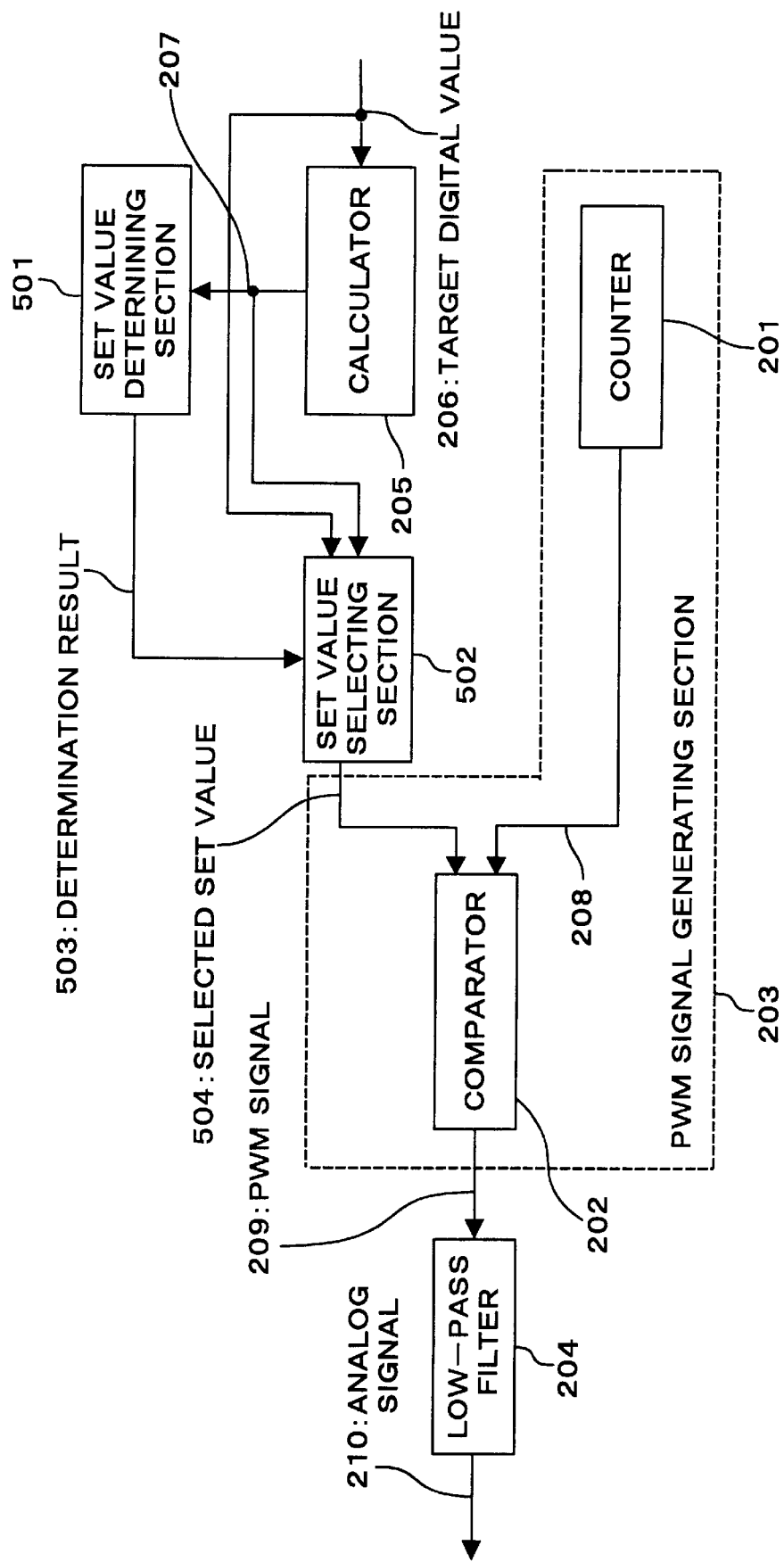
FIG. 5 is a block diagram showing a digital-to-analog converter according to a fourth embodiment of the present invention.

FIG. 5 shows the functional block of the digital-to-analog converter according to the fourth embodiment. It should be noted that the same reference numerals are added to the portions having the same functions as the digital-to-analog converter of the first embodiment. The digital-to-analog converter shown in FIG. 5 comprises a set value determining section 501 and a set value selecting section 502 in addition to the structural elements of the first embodiment.

The set value determining section 501 determines whether or not the actual set value 207 output from the set value calculator 205 exceeds a set range (upper and lower limits of a dynamic range) of the comparator 202, and outputs a determination result 503 to the set value selecting section 502.

If the determination result 503 exceeds the set range, the set value selecting section 502 outputs the target digital value 206 to the comparator 202 as a selected set value 504. If the determination result 503 does not exceed the set range, the set value selecting section 502 outputs the actual set value 207, which has been output from the set value calculator 205, to the comparator 202 as a selected set value 504.

Thus, according to the fourth embodiment, the accurate analog signal 210 can be generated in the vicinity of the maximum value of the set range and the minimum value thereof without having a complicated processing.

Also, even if the set value determining section 501 and the set value selecting section 502, which have been added to the fourth embodiment, are added to the structure of the second embodiment, the same effect can be obtained.

Further, the digital-to-analog converter of the fourth embodiment can be added to the mobile radio terminal apparatus of the third embodiment, so that the gain control of the transmission gain amplifier may be executed by the digital-to-analog converter.

In this case, the set value determining section 501 and the set value selecting section 502 are added to the PDM signal generating section 304 of FIG. 4. Or, the PWM signal generating section 203 is used in place of the PDM signal generating section 304, and the set value determining section 501 and the set value selecting section 502 are also used. As a result, the effect of the fourth embodiment can be obtained in the mobile radio terminal apparatus in addition to the effect of the third embodiment.

Fifth Embodiment

The fifth embodiment of the present invention shows an example of the digital-to-analog converter, which determines whether or not the digital value to be set exceeds a certain range, and which prolongs the set cycle used in the calculation of the actual set value and lessens the coefficient when the value exceed the range, in addition to the structural elements of the digital-to-analog converter of the fourth embodiment.

Figure 6:
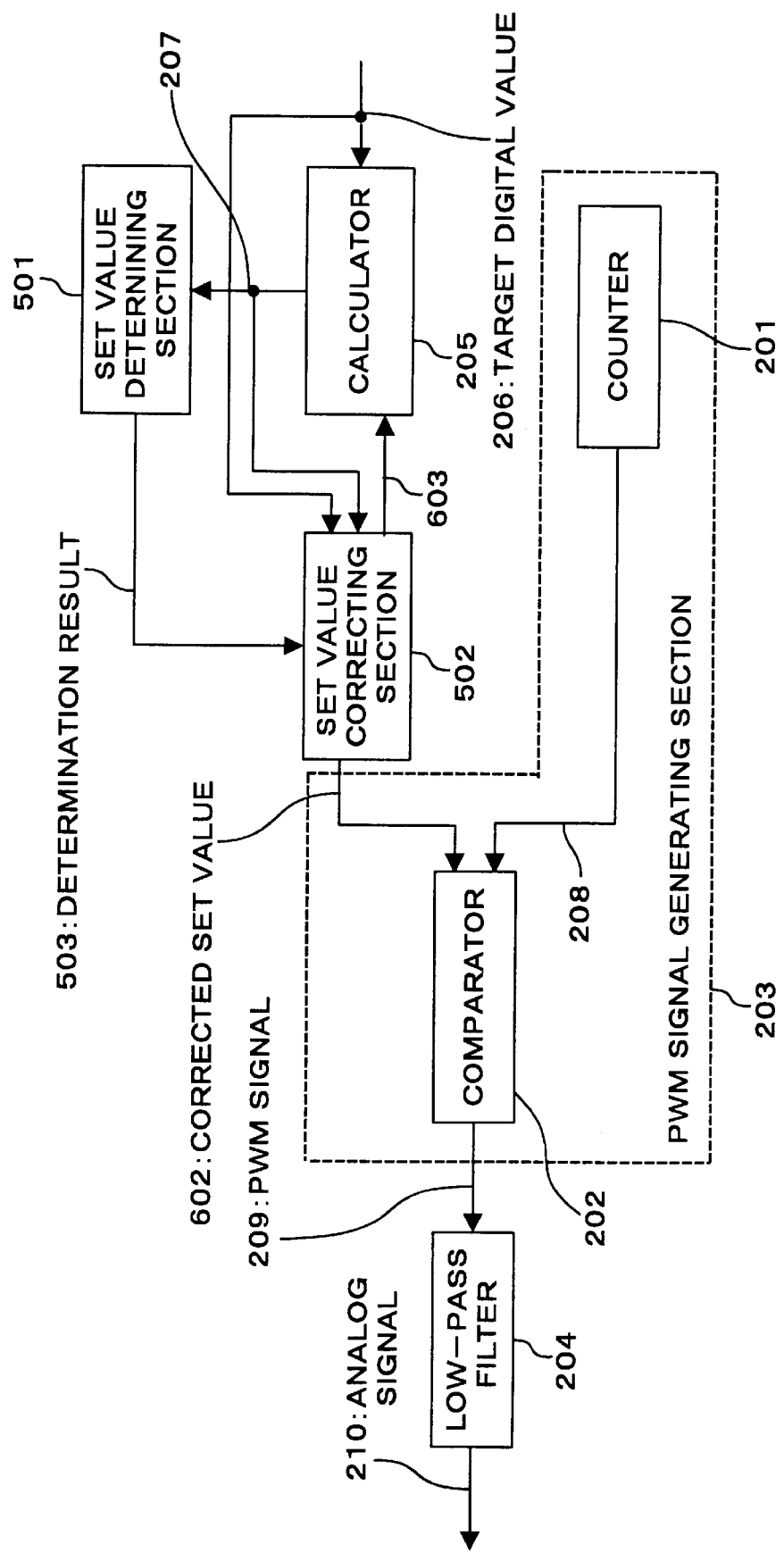
FIG. 6 is a block diagram showing a digital-to-analog converter according to a fifth embodiment of the present invention.

FIG. 6 shows the functional block of the digital-to-analog converter according to the fifth embodiment. It should be noted that the same reference numerals are added to the portions having the same functions as the digital-to-analog converter of the fourth embodiment.

The digital-to-analog converter of this embodiment comprises a set value correcting section 601 in place of the set value selecting section 502. If the determination result 503, which has been output from the set value determining section 501, exceeds the upper limit of the set range, the set value correcting section 601 sets the maximum value of the set range in the comparator 102 as a corrected set value 602. Conversely, if the determination result 503 is below the lower limit of the set range, the set value correcting section 601 sets the minimum value of the set range in the comparator 102 as a corrected set value 602.

The maximum value of the set range and the minimum value thereof are respectively substituted into equations (1) and (2) of the analog voltage calculation in the first embodiment. Then, the digital value converted to the analog voltage obtainable after the set cycle is calculated.

More specifically, the above calculations can be expressed by the following equations (5) to (8):

$$\text{When } D_{CUR} > D_{PRE}, \text{ Analog voltage} = R \times [D_{PRE} + (D_{CUR} - D_{PRE})\{1 - \exp(-T/C_T)\}] \quad (5)$$

$$\text{When } D_{PRE} > D_{CUR}, \text{ Analog voltage} = R \times [D_{PRE} - (D_{CUR} - D_{PRE})\{\exp(-T/C_T)\}] \quad (6)$$

The analog voltage can be thus obtained, and the converted digital value can be obtained as follows:

$$\text{When } D_{CUR} > D_{PRE}, \text{ Converted digital value} = D_{PRE} - (D_{CUR} - D_{PRE})\{1 - \exp(-T/C_T)\}] \quad (7)$$

$$\text{When } D_{PRE} > D_{CUR}, \text{ Converted digital value} = D_{PRE} - (D_{CUR} - D_{PRE})\{\exp(-T/C_T)\}] \quad (8)$$

where the set digital value is $D_{CUR}$, the previous set value is $D_{PRE}$, the set cycle is T, the time constant of the low-pass filter is $C_T$, and the digital value-to-analog voltage ratio is R.

A converted digital value 603 thus generated by the set value correcting section 601 is output to the set value calculator 205. The set value calculator 205 uses the converted digital value 603 as the previous set value at a next calculating time.

According to the fifth embodiment of the present invention, the analog signal 210 can be generated at a maximum response speed in the entire set range.

Even if the set value determining section 501 and the set value correcting section 601, which have been added to the fifth embodiment, are added to the second embodiment, the same effect can be obtained.

Moreover, the digital-to-analog converter of the fifth embodiment can be added to the mobile radio terminal apparatus of the third embodiment, so that the gain control of the transmission gain amplifier may be executed by the digital-to-analog converter.

In this case, the set value determining section 501 and the set value correcting section 601 are added to the PDM signal generating section 304 of FIG. 4. Or, the PWM signal generating section 203 of FIG. 6 is used in place of the PDM signal generating section 304, and the set value determining section 501 and the set value correcting section 601 are also used. As a result, the effect of the fifth embodiment can be obtained in the mobile radio terminal apparatus, in addition to the effect of the third embodiment.

As is obvious from the above explanation, according to the present invention, the actual set value having the variation, which is larger than the target set value, is set, so that the analog signal can be varied at higher speed. Then, it is unnecessary to perform the pulse-width modulation with the count value of the operation frequency that is more than necessary. This can reduce the consumption current.

Also, the value having the variation, which is larger than the target set value, is set, so that the analog signal can be varied at higher speed. Then, it is unnecessary to perform the pulse-density modulation with the count value of the operation frequency that is more than necessary. This can improve the reduction in consumption current. Moreover, there can be generated the analog signal having high stability and a small number of ripples as compared with the pulse-width modulation system.

Further, since the response speed can be accurately adjusted by the positive and negative changes, it is possible to realize the high-speed response using the low-speed operation frequency, thereby making it possible to reduce the consumption current. This application is based on the Japanese Patent Applications No. HEI10-29326 filed on Jan. 27, 1998, No. HEI10-258355 filed on Sep. 11, 1998 entire content of which are expressly incorporated by reference herein.

What is claimed is:

1. A digital-to-analog converter that decreases response delay caused by a filter time constant, comprising:
   a counter that repeatedly counts a predetermined count value;
   a modulating section that compares one of a count value output from said counter and a reversed count value in which upper bits and lower bits of said count value are reversed with an actual set value corresponding to a target digital value, said modulating section comprising a comparator, and generating one of a pulse-width modulation signal and pulse-density modulation signal;
   a low-pass filter that removes a high frequency component of one of said pulse-width modulation signal and said pulse-density modulation signal output from said modulating section to generate an analog signal; and
   a set value calculator for multiplying a difference between a current target digital value and a previous target digital value by a coefficient determined from a time constant of the low-pass filter and an update cycle of said target digital value, and adding a result of the multiplication to the previous target digital value to calculate said actual set value, whenever said target digital value is updated,
   wherein the coefficient cancels a decrease in a substantial variation of said target digital value, caused by the low-pass filter time constant.

2. The converter according to claim 1, wherein the coefficient comprises a reciprocal of a factor determined from the low-pass filter time constant and which decreases the substantial variation in said target digital value.

3. The converter according to claim 1, wherein said set value calculator changes the coefficient to be multiplied by the difference between the current target digital value and the previous target digital value, in accordance with a polarity of said difference.

4. The converter according to claim 1, wherein when the difference between the current digital vale and the previous digital value is positive, said set value calculator uses $1/\{1-\exp(-T/C_T)\}$ for the value of the coefficient to be multiplied by the difference, where T is an update cycle of the target set value and $C_T$ is the time constant of the low-pass filter, while when the difference is negative, said set value calculator uses $1/\{\exp(-T/C_T)\}$ as the value of the coefficient to be multiplied by the difference, where T is the update cycle of the target set value and $C_T$ is the time constant of the low-pass filter.

5. The converter according to claim 1, wherein said set value calculator calculates said actual set value according to one of the following relationships:

when $D_{CUR}-D_{PRE}>0$, actual set value$=D_{PRE}+\{(D_{CUR}-D_{PRE})/\{1-\exp(-T/C_T)\}\}$, and when $D_{CUR}-D_{PRE}<0$, actual set value$=D_{PRE}-(D_{PRE}-D_{CUR})1/\{\exp(-T/C_T)\}$, wherein $D_{CUR}$ is the target set value, $D_{PRE}$ is the previous target set value, T is an update cycle of the target set value, and $C_T$ is the time constant of the low-pass filter.

6. The converter according to claim 1, further comprising:
   a determining device that determines whether said actual set value exceeds a set capable range; and
   a selector that selects, as a selected value, the calculated actual set value, when the calculated actual set value does not exceed the set capable range as a result of the determination, and provides the selected value to the comparator as said actual set value.

7. The digital-to-analog converter according to claim 1, further comprising:
   a determining device that determines whether said actual set value exceeds a set capable range; and
   a set value corrector that prolongs a set cycle of the target digital value when the actual set value exceeds the set capable range as a result of the determination, and decreases the coefficient by which the difference between the current target digital value and the previous target digital value are multiplied to calculate the actual set value.

8. The digital-to-analog converter according to claim 1, further comprising:
   a determining device for determining whether said actual set value exceeds a set capable range; and
   a set value selector for selecting one of a set capable maximum value and a set capable minimum value as said actual set value when the actual set value exceeds the set capable range as a result of the determination, and for calculating an analog output value of said low-pass filter passed a next update period based on the time constant of said low-pass filter and the update cycle of the target digital value so as to obtain the actual set value corresponding to the calculated value.

9. A mobile radio terminal apparatus comprising:
   the digital-to-analog converter according to claim 1;
   a gain control amplifier that digitally modulates information data to amplify the modulation signal by a gain in accordance with an analog signal output by said digital-to-analog converter; and
   a radio unit for converting the gain-amplified analog signal to a radio frequency band to be transmitted.

10. A digital-to-analog converting method for pulse-width modulating a target digital value to convert to an analog value, while decreasing response delay caused by a filter time constant, comprising:
   counting a predetermined count value repeatedly;
   modulating an actual set value corresponding to a target digital value, using one of said count value and a reversed count value in which upper bits and lower bits of said count value are reversed, and thereby generating one of a pulse-width modulation signal and a pulse-density modulation signal;
   multiplying a difference between a current target digital value and a previous target digital value by a coefficient which is determined from the time constant of a low-pass filter and an update cycle of said target digital value the coefficient canceling a decrease in a substantial variation in said target digital value, caused by the low-pass filter time constant; and
   adding a value of the multiplication to the previous target digital value to calculate said actual set value.

11. The method according to claim 10, further comprising:
- determining whether said actual set value exceeds a set capable range; and
- selecting the target digital value as said actual set value when the calculated actual set value exceeds the set capable range as a result of the determination.

12. The method according to claim 10, further comprising:
- determining whether said actual set value exceeds a set capable range; and
- calculating the actual set value by prolonging the update cycle and decreasing the coefficient which is multiplied by the difference between the current target digital value and the previous target digital value when the actual set value exceeds the set range as a result of the determination.

13. The method according to claim 10, further comprising;
- determining whether said actual set value exceeds a set capable range;
- selecting one of a set capable maximum value and a set capable minimum value as said actual set value when the actual set value exceeds the set capable range as a result of the determination; and
- calculating an analog output value of said low-pass filter passed a next update period based on the time constant of said low-pass filter, for outputting the analog signal and the set cycle of the target digital value when one of said maximum value and said minimum value is selected as said actual set value.

* * * * *

UNITED STATES PATENT AND TRADEMARK OFFICE
CERTIFICATE OF CORRECTION

PATENT NO. : 6,462,692 B1  
DATED : October 8, 2002  
INVENTOR(S) : M. Moriya

It is certified that error appears in the above-identified patent and that said Letters Patent is hereby corrected as shown below:

Column 9,  
Line 48, "vale" should be -- value --.

Signed and Sealed this

Eleventh Day of March, 2003

JAMES E. ROGAN  
*Director of the United States Patent and Trademark Office*